(12) United States Patent
Choi

(10) Patent No.: US 8,178,432 B2
(45) Date of Patent: May 15, 2012

(54) SEMICONDUCTOR DEVICE AND METHOD FOR FABRICATING THE SAME

(75) Inventor: Yong Keon Choi, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 206 days.

(21) Appl. No.: 12/643,741

(22) Filed: Dec. 21, 2009

(65) Prior Publication Data

US 2010/0163983 A1 Jul. 1, 2010

(30) Foreign Application Priority Data

Dec. 31, 2008 (KR) .................. 10-2008-0138334

(51) Int. Cl.
*H01J 21/22* (2006.01)
*H01J 29/66* (2006.01)

(52) U.S. Cl. ...................... 438/549; 257/336

(58) Field of Classification Search .................. 438/230, 438/303, 543–549; 257/336, 344, E21.431, 257/E21.619
See application file for complete search history.

(56) References Cited

U.S. PATENT DOCUMENTS

2008/0012081 A1* 1/2008 Kudo .......................... 257/408
* cited by examiner

*Primary Examiner* — Calvin Lee
(74) *Attorney, Agent, or Firm* — The Law Offices of Andrew D. Fortney; Andrew D. Fortney

(57) ABSTRACT

Semiconductor devices and methods for fabricating the same are disclosed. The semiconductor device includes gate electrodes having sidewall spacers on a semiconductor substrate, double diffusion drain regions in the semiconductor substrate adjacent to the sidewall spacers, double diffusion junction regions aligned with the gate electrodes, and source/drain regions in the double diffusion junction regions.

11 Claims, 4 Drawing Sheets

SEMICONDUCTOR DEVICE AND METHOD FOR FABRICATING THE SAME

CROSS REFERENCE TO RELATED APPLICATION

This application claims the benefit of Korean Patent Application No. 10-2008-0138334, filed on 31 Dec. 2008, which is hereby incorporated by reference as if fully set forth herein.

BACKGROUND OF THE DISCLOSURE

1. Field of the Disclosure

The present invention relates to semiconductor devices and methods for fabricating the same, in which an extended drain region is self-aligned to a gate.

2. Discussion of the Related Art

In general, a DEMOS (Depletion-Enhancement CMOS, or drain-extended CMOS) device which can operate at a high voltage has an extended drain structure. However, in conventional DEMOS devices, the drain structure is not self-aligned to a gate, which can result in mismatch characteristic (e.g., with regard to drain current or threshold voltage) in conventional DEMOS devices, as shown in FIGS. 1A and 1B.

More specifically, the drain regions 14 and 28 in FIG. 1A or 1B are not self-aligned with the gates 13 and 30, respectively.

A CMOS device having a conventional LDD structure may have poor hot carrier injection (HCI) and mismatch characteristics due to shallow drain junctions and high density doping of the drain region near the gate and the channel region.

SUMMARY OF THE DISCLOSURE

Accordingly, the present invention is directed to a semiconductor device and a method for fabricating the same and addresses the limitations and disadvantages associated with conventional devices.

An object of the present invention is to provide a semiconductor device and a method for fabricating the same, in which a drain region is self-aligned to a gate.

Additional advantages, objects, and features of the disclosure will be set forth in part in the description which follows and in part will become apparent to those skilled in the art upon examination of the following or may be learned from practice of the invention. The objectives and other advantages of the invention may be realized and attained by the structure(s) and method(s) particularly pointed out in the written description and claims hereof as well as the appended drawings.

To achieve these objects and other advantages and in accordance with the purpose of the invention, as embodied and broadly described herein, a semiconductor device may include one or more gate electrodes a semiconductor substrate, sidewall spacers at sidewalls of the gate electrodes, double diffusion drain regions in the semiconductor substrate adjacent to the sidewall spacers, double diffusion junction regions comprising a lightly doped drain (LDD) implant adjacent to the gate electrode(s) and surrounding the double diffusion drain regions, and source/drain regions in the double diffusion junction regions.

In another aspect of the present invention, a method for fabricating a semiconductor device may include the steps of forming one or more gate electrodes on a semiconductor substrate having device isolation films therein, forming first sidewall spacers at sidewalls of the one or more gate electrodes, forming double diffusion drain regions by injecting impurities into the semiconductor substrate using the one or more gate electrodes and the sidewall spacers as masks, removing the first sidewall spacers, implanting impurities into the semiconductor substrate using the gate electrodes as a mask to form an LDD (lightly doped drain) region, performing a thermal treatment to diffuse the impurities in the LDD region and form double diffusion junction regions, and forming second sidewall spacers at the sidewalls of the one or more gate electrodes, and implanting impurities at a high dosage using the gate electrodes and the second sidewall spacers as a mask to form source and drain regions in the double diffusion drain junction regions on opposite sides of each of the gates.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle(s) of the disclosure. In the drawings.

DESCRIPTION OF SPECIFIC EMBODIMENTS

Figure 1A:
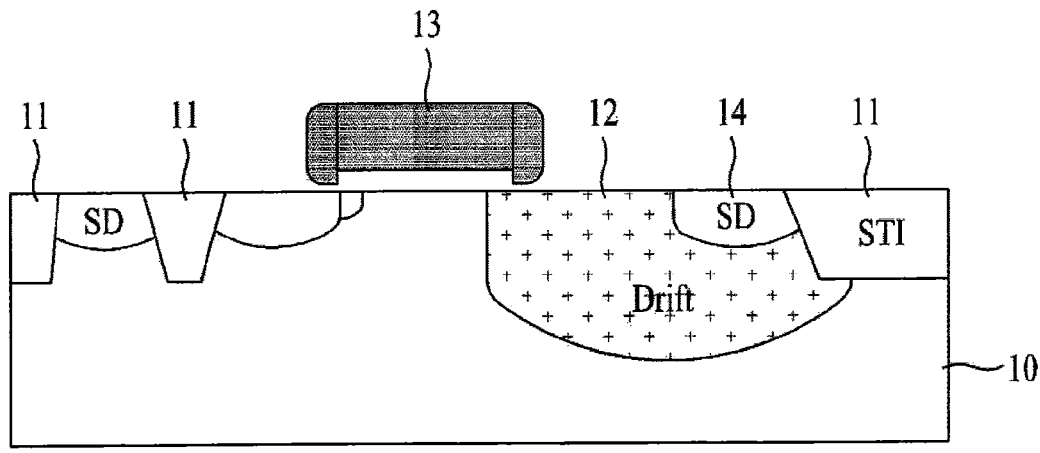
FIGS. 1A~1B are cross-sectional views showing structures formed in a related art method for fabricating a semiconductor device.
Figure 1B:
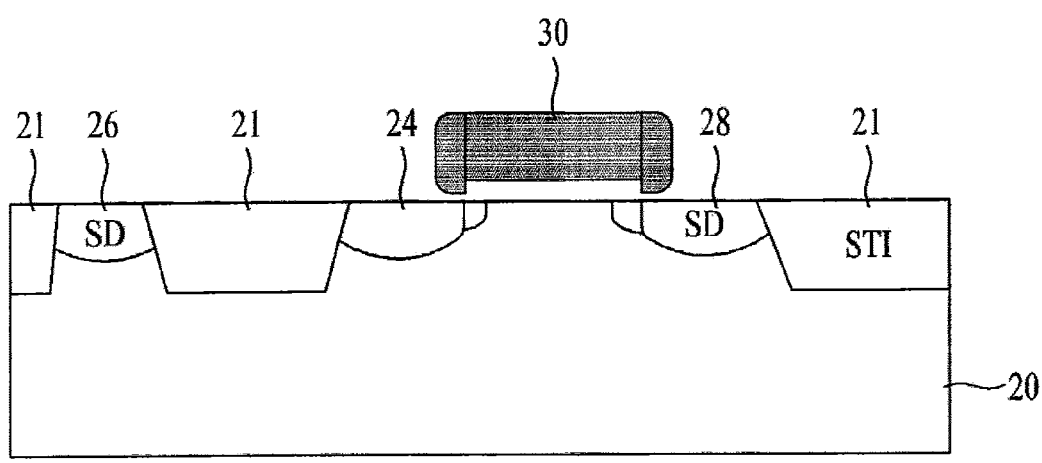

Reference will now be made in detail to the specific embodiments of the present invention, examples of which are illustrated in the accompanying drawings. Wherever possible, the same reference numbers will be used throughout the drawings to refer to the same or like parts.

A semiconductor device in accordance with embodiments of the present invention is described below in reference to FIG. 6.

The semiconductor device has shallow trench isolation (STI) structures for isolating N-wells or P-wells in a P-type or N-type semiconductor substrate (which may be a single crystalline semiconductor substrate, or a single-crystal silicon wafer with one or more layers of epitaxial silicon grown thereon).

The semiconductor device includes gate oxide films 120 and 125, gate electrodes 130 and 135, double diffusion drain region 150, double diffusion junction regions 160, 161, 162, and 163, and source/drain regions 170, 171, 172, 173, 174, and 175.

The double diffusion junction regions 160~163 are formed as follows: first, double diffusion drain regions 150~153 (see FIG. 4) are formed, then Lightly Doped Drain (LDD) regions are formed that are aligned with the gate electrodes 130 and 135 so that they are in area of the substrate adjacent to the gate where the double diffusion drain regions 150~153 are absent, and then the impurities in the double diffusion drain regions 150~153 and the LDD regions are thermally diffused to form double diffusion junction regions 160~163. Source/drain regions 170~175 (see FIG. 6) are then formed in the double diffusion junction regions 160~163.

Accordingly, the present semiconductor device, which may be operable at 5 V, has a drain region that is self-aligned with the gate electrodes, and, since the drain junction has a graded impurity distribution that decreases from the drain region to the gate electrode, the breakdown voltage and drain current characteristics of the device can be improved.

A semiconductor device and a method for fabricating a semiconductor device in accordance with embodiments of the present invention will be described with reference to FIGS. 2~6.

The present method may be used to form an extended drain structure for providing device characteristics that can operate effectively at a relatively high voltage (e.g., at 5 V).

Figure 2:
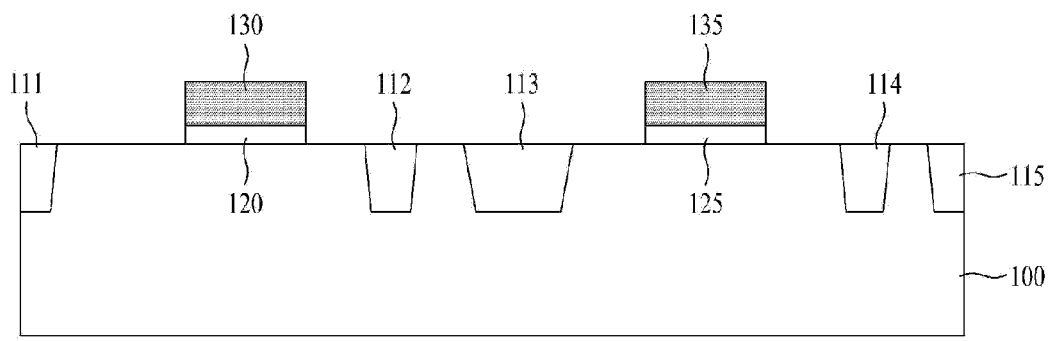
FIGS. 2~6 are cross-sectional views showing structures formed in an exemplary method for fabricating a semiconductor device in accordance with embodiments of the present invention.

Referring to FIG. 2, an initial pad oxide film (not shown) is formed on an N-type or a P-type semiconductor substrate 100 (which may be a single crystalline semiconductor wafer, or a single-crystal silicon wafer with one or more layers of epitaxial silicon grown thereon). A nitride film (not shown) is then formed on the pad oxide film. A photoresist layer (not shown) is then formed over the nitride film and is photolithographically patterned to define field regions. The nitride film, the pad oxide film, and the semiconductor substrate are then etched (e.g., anisotropically etched by dry etching, such as reactive ion etching [RIE]) to form isolation trenches (not shown) using the patterned nitride and pad oxide as a mask. An oxide layer may be blanket deposited (e.g., by chemical vapor deposition [CVD], such as low pressure CVD [LPCVD], or plasma enhanced CVD [PECVD]) over the semiconductor substrate 100, including in the isolation trenches. The oxide layer may then be partially removed (e.g., by chemical mechanical polishing [CMP] or by blanket etching) to form Shallow Trench Isolation (STI) structures 111~115.

Then, N wells and/or P wells are formed in active device regions of the semiconductor substrate. Subsequently, impurities are injected into the wells for adjusting the threshold voltage(s) of the devices to be formed in subsequent processing.

A gate oxide layer is formed over the semiconductor substrate 100 by thermal oxidation of the substrate (e.g., wet or dry thermal oxidation exposing the semiconductor substrate 100 to a temperature of 800 and 1200° C.), or by CVD (e.g., LPCVD or PECVD). Then, a polysilicon layer is deposited over the gate oxide layer (e.g., by LPCVD, PECVD, or low temperature CVD). A photoresist film is formed over the polysilicon layer. The photoresist film may then be photolithographically patterned and developed to expose the polysilicon layer except at gate electrode regions. The polysilicon layer is then etched (e.g., anisotropically by RIE) using the photoresist pattern as a mask to form gate electrodes 130 and 135 and thin gate oxide films 120 and 125.

The present method may be used to form a DE-CMOS (Depletion-Enhancement CMOS, or Drain-Extended CMOS) device in one region of the semiconductor substrate 100 (e.g., the left side in FIGS. 2~6), and a high voltage (HV) CMOS device in another region of the semiconductor substrate 100 (e.g., the right side of FIGS. 2~6). The HV device may be operable, for example, at 5 V.

Figure 3:
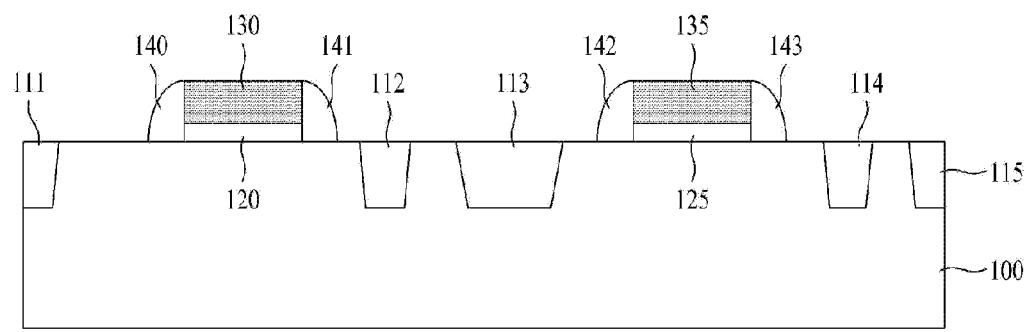

Referring to FIG. 3, a nitride film is deposited over an entire surface of the semiconductor substrate 100 including the gate electrodes 130 and 135 by physical vapor deposition (PVD; e.g., sputtering) or CVD (e.g., PECVD or LPCVD). The nitride film is then etched back to form sacrificial sidewall spacers 140, 141, 142, and 143 on sidewalls of each of the gate electrodes 130 and 135. The nitride film may have a thickness of, e.g., 50 to 200 Å. Optionally, a thin oxide layer having a thickness of, e.g., 10~50 Å may be deposited before the nitride film is deposited.

Figure 4:
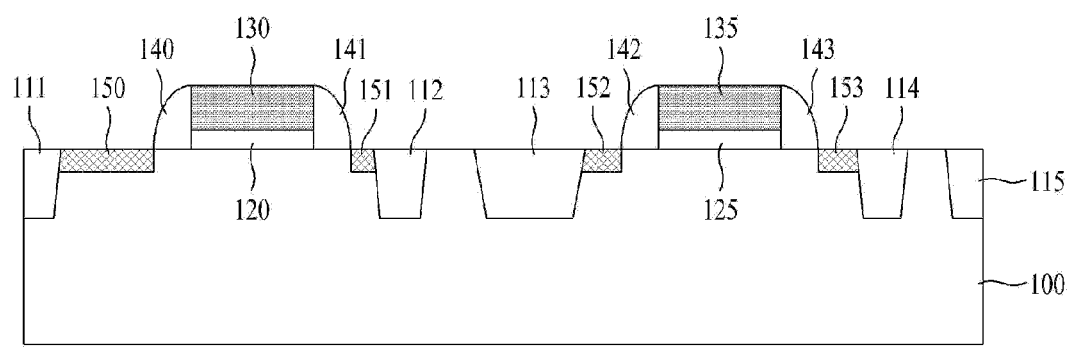

Referring to FIG. 4, impurity ions are injected into an entire surface of the semiconductor substrate 100 using the gate electrodes 130 and 135 and the sidewall spacers 140~143 as an implantation mask to form double diffusion extended drain regions 150, 151, 152, and 153.

If the double diffusion extended drain regions 150~153 are to be formed within a p well, an n-type impurity (e.g., P, As, and/or Sb) is injected to form the double diffusion extended drain regions, and if the double diffusion extended drain regions 150-153 are to be formed within an n well, a p-type impurity (e.g., B and/or $BF_2$) is injected to form the double diffusion extended drain regions.

Figure 5:
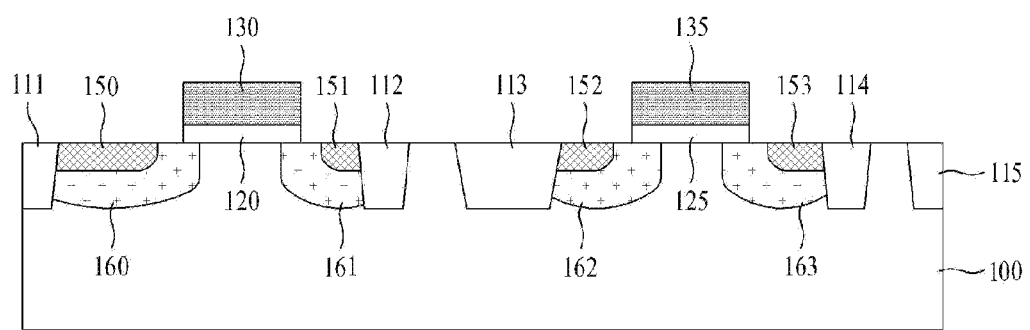

Referring to FIG. 5, the sidewall spacers 140~143 are removed by wet etching (e.g., using phosphoric acid) until an upper surface of the substrate 100 beneath the sidewall spacers 140 is exposed. Any oxide layer in the sidewall spacers 140 can also be removed by wet etching using, e.g., buffered aqueous hydrofluoric acid (HF).

Then, a lightly doped drain (LDD) implantation is performed on the semiconductor substrate 100, including the double diffusion extended drain regions 150~153. The LDD implantation includes injecting an impurity ion of the same conductivity type as the double diffusion extended drain regions (e.g., if the double diffusion extended drain regions were formed by injecting n-type impurity, an n-type impurity will be implanted to form the LDD). A thermal treatment step is then performed (e.g., by RTA at a temperature of 800° C. to about 1,200° C. for about 10 to 60 seconds) to diffuse the impurity in the double diffusion extended drain regions 150-153 and the LDD implants to form double diffusion junctions 160, 161, 162, and 163.

Since the LDD implantation step is performed after the sidewall spacers 140-143 are removed, the LDD impurity can be injected into larger areas of the upper surface of semiconductor substrate 100 than the double diffusion extended drain regions 150~153. The LDD implantation is also generally performed at a higher energy than the implantation for the double diffusion extended drain regions 150~153.

Moreover, since the thermal treatment step is performed after the LDD implant step is performed, the concentration of impurity in the drain junction is graded between the drain (e.g., 150) and a channel region beneath the gate (e.g., 130), and electric fields generated in the transistor can be spread over a greater area compared to related art devices.

Figure 6:
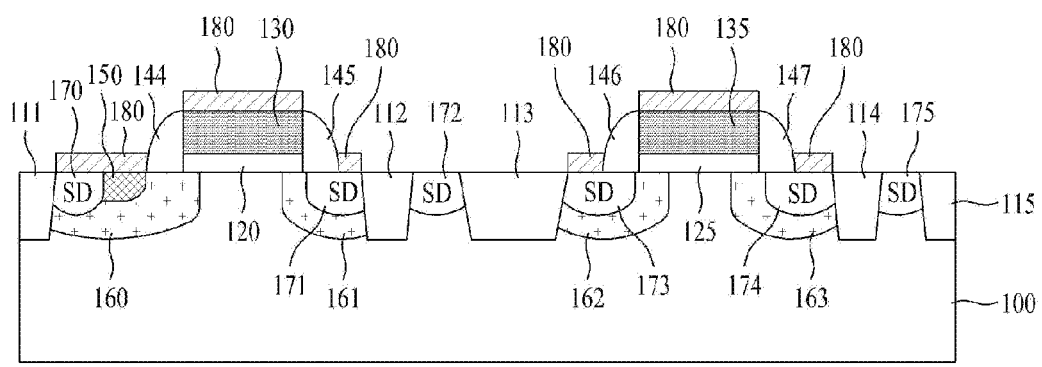

Referring to FIG. 6, a second nitride film is formed on an entire surface of the semiconductor substrate 100 including the gate electrodes 130 and 135 by PVD (e.g., sputtering) or CVD (e.g., PECVD or LPCVD), and is etched back to form second sidewall spacers 144, 145, 146, and 147 on the sidewalls of each of the gate electrodes 130 and 135. The second nitride film may have a thickness that is less than the nitride film used to form the sacrificial sidewall spacers 140~143. For example the second nitride film may have a thickness of about 40 to 150 Å. Optionally, a thin oxide layer having a thickness of, e.g., 10~20 Å may be deposited before the second nitride film is deposited.

Impurity ions of the same conductivity type as the double diffusion drain junctions 160~163 are injected into exposed areas of the semiconductor substrate 100 using the gate electrodes 130 and 135 and the sidewall spacers 144~147 as an implantation mask to form source/drain regions 170, 171, 172, 173, 174, and 175 in the semiconductor substrate 100 on opposite sides of each of the gate electrodes 130 and 135. For example, if the double diffusion extended drain regions were formed by injecting n-type impurity, n-type impurity may be injected to form source/drain regions 170~175. The source/drain regions 170~175 are substantially aligned with the double diffusion extended drain regions 150~153. Optionally, a photoresist pattern (not shown) may be formed over the semiconductor substrate 100 prior to forming source/drain regions 170~175 that covers a portion of the double diffusion extended drain region 150 adjacent to the gate electrode 130. The photoresist pattern may prevent impurity ions from being injected into the portion of the semiconductor substrate 100 between gate electrode 130 and double diffusion extended drain region 150 when the source/drain regions 170~175 are formed.

In this instance, it is preferable that the impurity ions in the source/drain regions 170~175 are present in a greater concentration than in the double diffusion junctions 160~163.

Cobalt (Co) is then deposited on the source/drain regions 170~175 and the gate electrodes 130 and 135 by CVD (e.g., PECVD), PVD (e.g., sputtering), or atomic layer deposition (ALD). Titanium nitride (TiN) is deposited over the cobalt layer by CVD (e.g., LPCVD) or PVD (e.g., sputtering). The metal layers are then annealed (e.g., by RTA at a temperature of about 600 to 1200° C.) to form a salicide layer 180 on the gate electrodes 130 and 135 and the source/drain regions 170-175.

The resulting semiconductor device of the present invention has self-aligned gates, and a graded drain junction in the HV (e.g., 5 V) CMOS device that increases a breakdown voltage of the device and improves the HCI characteristic of the device.

As has been described, the semiconductor device and the method for fabricating the same of the present invention have the following additional advantages.

The use of the double diffusion drain step permits forming the drain self-aligned to the gate.

It will be apparent to those skilled in the art that modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a semiconductor device comprising the steps of:
    forming one or more gate electrodes on a semiconductor substrate having device isolation films therein;
    forming first sidewall spacers on sidewalls of the one or more gate electrodes;
    injecting impurities into the semiconductor substrate using the one or more gate electrodes and the first sidewall spacers as a mask to form diffusion drain regions;
    removing the first sidewall spacers;
    implanting impurities into the semiconductor substrate to form lightly doped drain (LDD) regions;
    performing a thermal treatment to diffuse the impurities in the LDD region and form double diffusion junction regions;
    forming second sidewall spacers on sidewalls of the one or more gate electrodes; and
    forming source and drain regions in the double diffusion junction regions on opposite sides of each of the gates.

2. The method as claimed in claim 1, wherein an impurity concentration of the source and drain regions is higher than an impurity concentration of the double diffusion junction regions.

3. The method as claimed in claim 1, wherein the double diffusion junction regions are self-aligned with the one or more gate electrodes.

4. The method as claimed in claim 1, further comprising forming a salicide layer on the source and drain regions and the one or more gate electrodes.

5. The method as claimed in claim 1, wherein removing the first sidewall spacers comprises wet etching.

6. The method as claimed in claim 1, wherein the thermal treatment to form the double diffusion junction regions forms an impurity ion concentration gradient between the diffusion drain regions and the double diffusion junction regions.

7. The method as claimed in claim 1, wherein implanting impurities into the semiconductor substrate to form the LDD regions comprises using the one or more gate electrodes as a mask.

8. The method as claimed in claim 1, wherein the diffusion drain regions, the LDD regions, and the source and drain regions have a first conductivity type.

9. The method as claimed in claim 8, further comprising forming a well region in the semiconductor substrate.

10. The method as claimed in claim 9, wherein the well region has a second conductivity type.

11. The method as claimed in claim 1, wherein forming second sidewall spacers comprises depositing a nitride layer and etching back the nitride layer.

* * * * *